(12) United States Patent
Herman et al.

(10) Patent No.: US 9,240,001 B2
(45) Date of Patent: Jan. 19, 2016

(54) SYSTEMS AND METHODS FOR VEHICLE SURVIVABILITY PLANNING

(75) Inventors: Carl R. Herman, Owego, NY (US); David Howe, Grand Praire, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 447 days.

(21) Appl. No.: 13/463,671

(22) Filed: May 3, 2012

(65) Prior Publication Data

US 2013/0297271 A1 Nov. 7, 2013

(51) Int. Cl.
| | |
|---|---|
| G06F 7/60 | (2006.01) |
| G06F 17/10 | (2006.01) |
| G06Q 10/10 | (2012.01) |
| G08G 5/00 | (2006.01) |
| G06F 17/50 | (2006.01) |

(52) U.S. Cl.
CPC ............... *G06Q 10/10* (2013.01); *G08G 5/006* (2013.01); *G06F 17/50* (2013.01); *G08G 5/0086* (2013.01)

(58) Field of Classification Search
CPC ...... G06F 17/50; G08G 5/006; G08G 5/0039; G08G 5/0086; G08G 5/0095; G08G 5/045; G06Q 10/10
USPC .............. 703/8, 2, 6; 701/1, 9, 6, 528; 342/13
See application file for complete search history.

(56) References Cited

U.S. PATENT DOCUMENTS

| | | | |
|---|---|---|---|
| 4,449,041 A | 5/1984 | Girard | |
| 4,760,396 A | 7/1988 | Barney et al. | |
| 4,812,990 A * | 3/1989 | Adams et al. | .............. 701/3 |
| 4,947,350 A | 8/1990 | Murray et al. | |
| 5,086,396 A | 2/1992 | Waruszewski, Jr. | |
| 5,111,400 A | 5/1992 | Yoder | |
| 5,122,801 A | 6/1992 | Hughes | |
| 5,287,110 A | 2/1994 | Tran | |
| 5,406,286 A | 4/1995 | Tran et al. | |
| 5,410,313 A | 4/1995 | Tran | |

(Continued)

FOREIGN PATENT DOCUMENTS

| | | |
|---|---|---|
| CA | 2580978 A1 | 3/2006 |
| CN | 201918032 U | 8/2011 |

(Continued)

OTHER PUBLICATIONS

Butters, Brian et al., "Infrared Decoy and Obscurant Modeling and Simulation for Ship Protection", 2011, Technologies for Optical Countermeasures VII, SPIE.*

(Continued)

*Primary Examiner* — Kamini S Shah
*Assistant Examiner* — Cedric D Johnson
(74) *Attorney, Agent, or Firm* — Wolf, Greenfield & Sacks, P.C.

(57) ABSTRACT

System and methods for improving vehicle survivability. In some embodiments, Mission information may be obtained regarding a mission of at least one vehicle. The mission may comprise a plurality of mission stages, and the mission information may comprise at least one model associated with the at least one vehicle and at least one threat to the at least one vehicle. A potential action of the at least one vehicle may be selected by calculating a numerical measure for the potential action based at least in part on a mission stage of the plurality of mission stages during which the potential action is to be taken and the at least one model.

20 Claims, 11 Drawing Sheets

(56) References Cited

U.S. PATENT DOCUMENTS

| | | | |
|---|---|---|---|
| 5,428,530 A | 6/1995 | Brown et al. | |
| 5,442,556 A | 8/1995 | Boyes et al. | |
| 5,457,460 A | 10/1995 | Tran et al. | |
| 5,461,571 A | 10/1995 | Tran | |
| 5,549,477 A | 8/1996 | Tran et al. | |
| 5,574,458 A | 11/1996 | Tran | |
| 5,606,500 A | 2/1997 | Tran | |
| 5,631,640 A | 5/1997 | Deis et al. | |
| 5,787,333 A | 7/1998 | Rasinski et al. | |
| 5,838,262 A | 11/1998 | Kershner et al. | |
| 6,002,347 A | 12/1999 | Daly et al. | |
| 6,127,944 A | 10/2000 | Daly et al. | |
| 6,267,039 B1 * | 7/2001 | Czarnecki | 89/1.11 |
| 6,282,526 B1 | 8/2001 | Ganesh | |
| 6,538,581 B2 | 3/2003 | Cowie | |
| 6,734,824 B2 | 5/2004 | Herman | |
| 6,778,906 B1 | 8/2004 | Hennings et al. | |
| 6,980,151 B1 | 12/2005 | Mohan | |
| RE39,053 E | 4/2006 | Rees | |
| 7,120,445 B2 | 10/2006 | DeMarco et al. | |
| 7,161,500 B2 | 1/2007 | Alfredsson et al. | |
| 7,194,353 B1 | 3/2007 | Baldwin et al. | |
| 7,206,444 B2 | 4/2007 | Herman | |
| 7,422,175 B1 | 9/2008 | Bobinchak et al. | |
| 7,769,502 B2 | 8/2010 | Herman | |
| 7,848,879 B2 | 12/2010 | Herman | |
| 7,979,199 B2 | 7/2011 | Judd et al. | |
| 8,005,657 B2 | 8/2011 | Herman et al. | |
| 8,009,515 B2 | 8/2011 | Cecala et al. | |
| 8,025,230 B2 | 9/2011 | Moraites et al. | |
| 8,185,256 B2 | 5/2012 | Herman | |
| 8,791,836 B2 | 7/2014 | Herman | |
| 8,831,793 B2 | 9/2014 | Herman | |
| 8,902,098 B2 | 12/2014 | Langsford | |
| 2002/0150866 A1 | 10/2002 | Perry et al. | |
| 2003/0060942 A1 | 3/2003 | Kotzev et al. | |
| 2003/0154010 A1 | 8/2003 | Rao et al. | |
| 2003/0215771 A1 | 11/2003 | Bartoldus et al. | |
| 2004/0219491 A1 | 11/2004 | Shlomo | |
| 2005/0038628 A1 | 2/2005 | Beuttel et al. | |
| 2005/0073439 A1 | 4/2005 | Perricone | |
| 2005/0256682 A1 | 11/2005 | Galutia et al. | |
| 2005/0275582 A1 | 12/2005 | Mohan | |
| 2006/0142903 A1 | 6/2006 | Padan | |
| 2006/0184292 A1 | 8/2006 | Appleby et al. | |
| 2006/0266203 A1 | 11/2006 | Herman et al. | |
| 2006/0267827 A1 | 11/2006 | Ferm et al. | |
| 2006/0271245 A1 | 11/2006 | Herman | |
| 2007/0023582 A1 | 2/2007 | Steele et al. | |
| 2007/0210953 A1 | 9/2007 | Abraham et al. | |
| 2007/0244673 A1 | 10/2007 | Khosla et al. | |
| 2007/0288208 A1 | 12/2007 | Grigsby et al. | |
| 2008/0052054 A1 | 2/2008 | Beverina et al. | |
| 2008/0077474 A1 | 3/2008 | Dumas et al. | |
| 2008/0111728 A1 | 5/2008 | Stevens | |
| 2008/0133070 A1 | 6/2008 | Herman | |
| 2008/0136701 A1 | 6/2008 | Ferm et al. | |
| 2008/0158256 A1 | 7/2008 | Russell et al. | |
| 2008/0258063 A1 | 10/2008 | Rapanotti | |
| 2008/0291075 A1 | 11/2008 | Rapanotti | |
| 2008/0297395 A1 | 12/2008 | Dark et al. | |
| 2009/0173788 A1 | 7/2009 | Moraites et al. | |
| 2009/0271157 A1 | 10/2009 | Herman et al. | |
| 2009/0322584 A1 | 12/2009 | Herman | |
| 2010/0010793 A1 * | 1/2010 | Herman | 703/8 |
| 2010/0017114 A1 | 1/2010 | Tehan et al. | |
| 2010/0135120 A1 | 6/2010 | Cecala et al. | |
| 2010/0145552 A1 | 6/2010 | Herman et al. | |
| 2010/0208075 A1 | 8/2010 | Katsuno | |
| 2010/0231418 A1 | 9/2010 | Whitlow et al. | |
| 2010/0253567 A1 | 10/2010 | Factor et al. | |
| 2011/0001062 A1 | 1/2011 | Herman et al. | |
| 2011/0029234 A1 | 2/2011 | Desai et al. | |
| 2011/0196551 A1 | 8/2011 | Lees et al. | |
| 2012/0078498 A1 | 3/2012 | Iwasaki et al. | |
| 2012/0276517 A1 | 11/2012 | Banaszuk et al. | |
| 2013/0124089 A1 | 5/2013 | Herman et al. | |
| 2013/0234864 A1 | 9/2013 | Herman | |
| 2013/0245931 A1 | 9/2013 | Rosswog et al. | |
| 2013/0259300 A1 | 10/2013 | Rosswog et al. | |
| 2013/0293406 A1 | 11/2013 | Herman | |
| 2013/0297096 A1 | 11/2013 | Herman | |
| 2014/0309808 A1 | 10/2014 | Herman | |

FOREIGN PATENT DOCUMENTS

| | | |
|---|---|---|
| WO | WO 2006/033112 A3 | 3/2006 |
| WO | WO 2013/122521 A1 | 8/2013 |

OTHER PUBLICATIONS

Bourassa, Neil Robert, "Modeling and Simulation of Fleet Air Defense Systems using EADSIM", Jun. 1993, Calhoun Institutional Archive of the Naval Postgraduate School, Dudley Knox Library.*

International Search Report and Written Opinion for PCT/US2013/039412 mailed Jan. 31, 2014.

International Preliminary Report on Patentability for PCT/US2013/039412 mailed Nov. 13, 2014.

* cited by examiner

US 9,240,001 B2

SYSTEMS AND METHODS FOR VEHICLE SURVIVABILITY PLANNING

BACKGROUND

Military and non-military vehicles moving through a hostile region may encounter multiple threats, such as enemy vehicles, ground troops, and/or artillery systems. Such threats may have weapon systems and may be equipped with multispectral sensors for obtaining information about target vehicles. For instance, a threat may be equipped with one or more passive sensors to obtain information about a target vehicle by detecting emissions from the target vehicle. An example of a passive sensor is an infrared (IR) sensor for detecting energy in the infrared band, such as thermal radiation, emitted by a target vehicle. A threat may also be equipped with one or more active sensors to obtain information about a target vehicle by irradiating the target vehicle with electromagnetic waves and detecting those waves that bounce back from the target vehicle. An example of an active sensor is a radar for transmitting and detecting radio frequency (RF) waves.

Threats may be located at known or unknown locations, and may have known or unknown capabilities for detecting and attacking target vehicles. A survivability planning system may analyze known threats prior to the start of a mission to improve vehicle survivability. For example, a survivability planning system may plan a safe route for a vehicle between a starting point and an ending point so as to avoid areas that are within detection and attack ranges of known threats.

Unknown threats, for example, those that "pop-up" during a mission, may be more challenging to defend against because a survivability planning system may lack sufficient time and information to automatically compute an optimal plan before a pop-up threat engages a target vehicle. As a result, conventional vehicles rely on human operators to decide when and where to position and route the vehicles with respect to pop-up threats. Survivability of such a vehicle thus depends directly on the information an individual operator has regarding an area of operation, locations of threats, and each threat's detection and attack capabilities against the vehicle in the specific environment.

SUMMARY

In some embodiments, a system for improving vehicle survivability is disclosed. The system comprises at least one processor programmed to: obtain mission information regarding a mission of at least one vehicle, the mission comprising a plurality of mission stages, the mission information comprising at least one model associated with the at least one vehicle and at least one threat to the at least one vehicle; and select a potential action of the at least one vehicle by calculating a numerical measure for the potential action based at least in part on a mission stage of the plurality of mission stages during which the potential action is to be taken and the at least one model.

In some embodiments, a method for improving vehicle survivability is disclosed. The method comprises obtaining mission information regarding a mission of at least one vehicle, the mission comprising a plurality of mission stages, the mission information comprising at least one model associated with the at least one vehicle and at least one threat to the at least one vehicle; and selecting a potential action of the at least one vehicle by calculating a numerical measure for the potential action based at least in part on a mission stage of the plurality of mission stages during which the potential action is to be taken and the at least one model.

In some embodiments at least one non-transitory computer-readable storage medium is disclosed. The at least one non-transitory computer-readable storage medium stores processor-executable instructions that, when executed by at least one processor, cause the at least one processor to: obtain mission information regarding a mission of at least one vehicle, the mission comprising a plurality of mission stages, the mission information comprising at least one model associated with the at least one vehicle and at least one threat to the at least one vehicle; and select a potential action of the at least one vehicle by calculating a numerical measure for the potential action based at least in part on a mission stage of the plurality of mission stages during which the potential action is to be taken and the at least one model.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF DRAWINGS

The accompanying drawings are not necessarily drawn to scale. For purposes of clarity, not every component may be labeled in every drawing.

DETAILED DESCRIPTION

Figure 1:
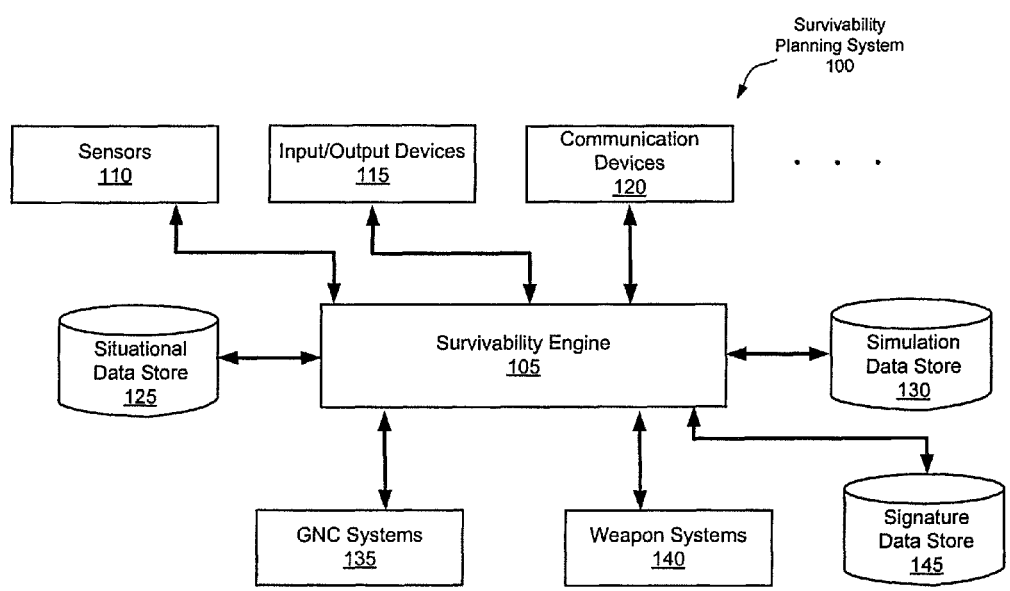
FIG. 1 shows an example of an illustrative survivability planning system, in accordance with some embodiments.

The inventors have recognized and appreciated that, when a human operator attempts to determine how to respond to a pop-up threat in a dynamic and high-stress environment, the human operator may not be able to take into account all factors that may impact vehicle survivability. Accordingly, in some embodiments, systems and methods are provided for automatically selecting one or more actions that may improve vehicle survivability in a multi-threat environment. In some embodiments, the selected actions may be presented to a human operator as recommendations. In alternative embodiments, for example, in an unmanned aerial vehicle (UAV), the selected actions may be automatically implemented to control the UAV.

In one aspect, the inventors have recognized and appreciated that multiple factors may impact vehicle survivability, including, but not limited to, vehicle speed, altitude, and aspect, vehicle maneuverability, threat lethality and detection capability against vehicle, vehicle lethality and detection capability against threat, geometry of vehicle relative to threat, terrain conditions, weather conditions, mission objective, and mission importance. Such factors, either alone or in combination, may affect a vehicle's abilities to detect a threat, evade detection by the threat, mitigate the threat using a countermeasure, and survive an attack by the threat. Accordingly, in some embodiments, mechanisms may be provided by which a survivability planning system may take into account any suitable combination of factors in selecting an appropriate course of action for a vehicle. For example, the survivability planning system may take into account information about one or more threats to the vehicle, one or more signature exposure models associated with the vehicle relative to the one or more threats, geometry of the vehicle and/or the one or more threats, situational data, and various other types of information. In one implementation, a survivability planning system may model a physical region as a collection of cells, and may model movement of a vehicle through the physical region as a sequence of maneuvers between cells. The survivability planning system may assign to each maneuver a numerical measure indicative of how much positive or negative impact the maneuver may have on the overall survivability of the vehicle, where the numerical measure may reflect any suitable combination of any of the aforementioned factors and other factors.

In another aspect, the inventors have recognized and appreciated that a vehicle may be operated based at least in part on one or more signature exposure models associated with the vehicle. In some embodiments, one or more signature exposure models associated with the vehicle may be used by a survivability planning system to select an appropriate course of action in view of one or more threats to the vehicle. A survivability planning system may use information about the one or more threats to identify one or more relevant signature exposure model associated with the vehicle, and select an appropriate course of action for the vehicle based at least in part on the identified one or more signature exposure models. For example, a survivability planning system may determine that the vehicle may be exposed to an enemy radar system (or any other enemy sensor) and, in response, may identify a signature exposure model indicative of how the vehicle may appear to the enemy radar system and select a maneuver for the vehicle to perform (e.g., to orient vehicle in a particular way) to reduce visibility of the vehicle to the enemy radar system.

In some embodiments, a survivability planning system may select a course of action in response to a threat based on a stage of a vehicle's mission. A mission may have any of numerous stages including, but not limited to, a detection stage in which the vehicle may be detected by a threat, a tracking stage in which the vehicle may be tracked by the threat, a firing stage where a vehicle may be fired at, and an impact stage where the vehicle may be hit. A survivability planning system may select different courses of action in each of these stages and may choose to weigh different factors in making the selection. For example, in the detection stage a course of action may be selected to reduce exposure of the vehicle to an enemy sensor and in the firing stage a course of action may be selected to reduce probability of the vehicle being hit.

It should be appreciated, that the survivability planning system may select a course of action in response to any suitable type of threat and, more generally, any reference to a threat, herein, may reference any suitable type of threat. For example, the threat may be a military threat such as one or more military vehicles, weapons, sensors, and/or enemy ground troops. As another example, the threat may be a threat in a commercial setting such as another vehicle (e.g., a car, a ship, a motorcycle, etc.) or one or more people (e.g., pedestrians) near or on a collision course with the vehicle. Numerous other examples will be apparent to those skilled in the art. As such, it is contemplated that embodiments of the present invention may operate in any of numerous environments, including military and non-military environments, as aspects of the present invention are not limited in this respect.

In another aspect, the inventors have recognized and appreciated that a vehicle may encounter multiple threats at the same time during a mission. These threats may have different capabilities and may be located at different locations, so that an optimal strategy with respect to one threat may lead to undesirable outcomes with respect to another threat. Accordingly, in some embodiments, a survivability planning system may model and analyze a scenario in such a manner as to simultaneously take into account information regarding multiple threats, thereby improving the vehicle's overall survivability. For example, in one implementation, a survivability planning system may assign multiple numerical measures to each potential action for a vehicle in a given scenario, where each of the numerical measures may correspond to a different threat present in the scenario and may be indicative of a severity of the threat. Such individual numerical measures may be combined in any suitable way to obtain a combined numerical measure for use in selecting an appropriate course of action for the vehicle.

In yet another aspect, the inventors have recognized and appreciated that the response time of a survivability planning system may be significantly improved by performing some computationally intensive analyses ahead of time, for example, by running scenario-specific simulations prior to the start of a mission. Accordingly, in some embodiments, a survivability planning system may use not only situational data indicative of actual conditions under which a vehicle is operating, but also simulation data obtained from off-line simulations of various vehicle-to-threat scenarios. For instance, in some embodiments, a survivability planning system may have access to multiple sets of simulation data corresponding to different vehicle-to-threat scenarios. During a mission (e.g., in response to detecting one or more pop-up threats), the survivability planning system may use situational data to identify a matching vehicle-to-threat scenario, and may use simulation data corresponding to the identified scenario to select one or more appropriate actions. In this manner, the survivability planning system may be able to analyze and compare outcomes of different courses of action without having to perform extensive computations in real time.

In yet another aspect, the inventors have recognized and appreciated that visual representations of mission-related information, such as a vehicle's exposure to a particular threat and the vehicle's abilities to detect and attack the threat, may facilitate a human operator's understanding and analysis of a vehicle-to-threat scenario, which may in turn improve the quality of the human operator's decision as to a suitable course of action. Accordingly, in some embodiments, a survivability planning system may be adapted to visually render vehicle signature, sensor obscuration, countermeasure effectiveness, vehicle vulnerability, or any other suitable type of information to a human operator. For example, visual representations may be rendered based on situational data regarding a pop-up threat. Alternatively, or additionally, visual representations may be rendered based on simulation data to help the human operator understand and compare outcomes of different courses of action.

Following below are more detailed descriptions of various concepts related to, and embodiments of, inventive systems, methods, and apparatus for improving vehicle survivability. It should be appreciated that various concepts introduced above and discussed in greater detail below may be implemented in any of numerous ways, as the disclosed concepts are not limited to any particular manner of implementation. For instance, the present disclosure is not limited to the particular arrangements of components shown in the various figures, as other arrangements may also be suitable. Such examples of specific implementations and applications are provided solely for illustrative purposes.

Furthermore, any of the inventive concepts disclosed herein may be implemented in connection with any of the systems and methods described in U.S. Pat. No. 7,769,502, titled "Survivability/Attack Planning System," U.S. Pat. No. 7,848,879, titled "Survivability System," U.S. Pat. No. 8,005,657, titled "Survivability Mission Modeler," and U.S. Patent Application Publication No. 2010/0010793 A1, titled "Vehicle Aspect Control," all of which are hereby incorporated by reference in their entireties.

FIG. 1 shows an example of an illustrative survivability planning system 100, in accordance with some embodiments. The survivability planning system 100 may be used in any suitable vehicle to improve survivability in an environment comprising one or more threats to the vehicle. Examples of vehicles include, but are not limited to, airplanes, helicopters, rockets, missiles, gliders, spacecraft, lighter-than-air craft, hovercraft, cars, trucks, motorcycles, tanks, heavy equipment, naval vessels, watercraft, submarines, and the like. A vehicle may be manned or unmanned, and may be operated manually or automatically, or by a suitable combination of manual control and automatic control. Furthermore, a vehicle may be owned and/or operated by any suitable entity, such as a military entity, a commercial entity, or a private entity.

In the example shown in FIG. 1, the survivability planning system 100 includes a survivability engine 105 adapted to process situational and simulation data, and to select one or more appropriate actions for a vehicle in a given scenario. The selected actions may be presented as recommendations to a human operator, who may be onboard the vehicle (e.g., a pilot of an aircraft, a driver of a car, etc.), or controlling the vehicle remotely. Alternatively, the selected actions may be automatically implemented to control one or more systems on the vehicle.

The survivability planning system 100 may include one or more components that allow the survivability engine 105 to collect and disseminate information. For example, in some embodiments, the survivability planning system 100 may receive input from one or more sensors 110 onboard the vehicle and may provide control signals to influence how the sensors collect information. The sensors 110 may sense situational conditions using any suitable passive and/or active sensing technologies, including, but not limited to, radar, IR, sonar, video image, laser, and acoustic sensing technologies. For instance, some sensors may be configured to sense operating conditions of the vehicle, such as latitude, longitude, altitude, heading, orientation, speed, acceleration, and changes (and/or rates of changes) in any of such operating conditions. Some other sensors may sense environmental conditions, such as light, humidity, atmospheric pressure, wind speed, and wind direction. Yet some other sensors may provide information regarding one or more threats that may be present. For example, a target recognition sensor may provide information relating to threat type (e.g., a weapons system, another vehicle (e.g., another aircraft, another car, another ship, etc.), and an enemy sensor system), and a range sensor (e.g., radar or laser radar) may estimate a distance between the vehicle and a detected threat. Other types of sensors may also be suitable, as aspects of the present disclosure are not limited to the use of any particular type of sensors.

In some further embodiments, the survivability engine 105 may interact with a human operator onboard the vehicle, or a human operator remotely controlling the vehicle, via one or more input/output devices 115. Examples of input/output devices include, but are not limited to, touch-sensitive displays, heads-up displays (HUDs), keyboards, buttons, switches, levers, speakers, headphones, speakers, microphones, video cameras, and tactors configured to tactually present information to a human operator by relying on the human operators sense of touch. Some of these input/output devices may be coupled with an appropriate recognition engine, such as a speech, gesture, or handwriting recognition engine, to recognize input from the human operator.

In yet some further embodiments, the survivability engine 105 may receive and transmit information via one or more communication devices 120, which may use any suitable communication technologies such as radio and microwave technologies. The communication devices 120 may allow the survivability engine 105 to interact with a remote system, such as a command center or another vehicle, and may allow the survivability engine 105 to receive any suitable information (e.g., intelligence information and location information about one or more threats to the vehicle).

In the example shown in FIG. 1, the survivability planning system 100 further includes a situational data store 125, a simulation data store 130, and a signature data store 145. The situational data store 125 may store any useful information, such as mission objectives, locations and capabilities of known or likely threats, vehicle capabilities and vulnerabilities, locations and capabilities of friendly entities, terrain and weather conditions, and weather predictions. Such information may be loaded into the situational data store 125 prior to the start of a mission, or may be collected and stored during the mission. For example, the survivability engine 105 may use inputs received from the sensors 110, the input/output devices 115, and the communication devices 120 to update the information stored in the situational data store 125.

The simulation data store 130 may store data obtained from off-line simulations of various vehicle-to-threat scenarios. For instance, in some embodiments, a simulation may be conducted by building a model of a specific vehicle-to-threat scenario based on hypothetical situational conditions and using the model to analyze potential courses of action in the scenario. The model may be built using any suitable technique or combination techniques, including, but not limited to, those described in greater detail below in connection with FIGS. 3 and 4A-B. Likewise, any suitable optimization techniques may be used to identify acceptable courses of action, such as techniques that seek to decrease cost and/or increase utility over some suitable horizon (which may be finite or infinite).

The signature data store 145 may store one or more signature exposure models associated with a vehicle. Each signature exposure models may also correspond to one or more types of threats. For example, a signature exposure model may correspond to a particular type of enemy sensor (e.g., an RF, electro-optical, or IR sensor operating at a particular band of frequencies). The one or more signature exposure models may be created using data generated from offline simulation and/or data collected while using the vehicle (e.g., by measuring energy emitted from and/or reflected by the vehicle using one or more sensors).

In some embodiments, a signature exposure model may represent the way a vehicle may appear to a sensor. Each sensor may have a corresponding signature exposure model because the vehicle may appear differently when examined, either passively or actively, at different sets of frequencies. For example, the vehicle may appear differently when examined by an RF sensor (e.g., a radar) than when examined by an IR sensor (e.g., an infrared camera).

A signature exposure model may store one or more values associated with a set of relative geometries between the vehicle and a sensor. For example, a vehicle may appear differently to a sensor from a nose-on orientation than from a sideways orientation. As such, the signature exposure model may store one or more values for each pair of azimuth-elevation coordinates. Some examples of signature exposure models are described in greater detail below in connection with FIGS. 6A and 6B. However, it should be appreciated that information captured by a signature exposure model may be organized and/or indexed in any other suitable way.

In some embodiments, a simulation may involve the same types of analyses carried out by the survivability engine 105 in real time to analyze actual situational data, the only difference being some or all of the inputs used in the simulation are hypothetical data. In other embodiments, a simulation may involve different analyses (e.g., analyses that the survivability engine 105 may not be able to perform in real time due to constraints in computational resources). For instance, in one implementation, one or more situational conditions may be modeled as a probability distribution to represent imperfect information or uncertainty. Such an input probability distribution may be sampled to estimate probabilities of certain outcomes, such as a vehicle surviving or not surviving an attack by a threat. This computation may be done in an offline simulation for different input probability distributions, and the outcome probability distributions may be stored in the simulation data store 130 in association with the corresponding input probability distributions. In this manner, the survivability engine 105 may be able to retrieve an appropriate outcome probability distribution by identifying an input probability distribution that matches actual situational data, without having to compute the outcome probability distribution in real time.

In the example shown in FIG. 1, the survivability engine 105 further interacts with one or more guidance, navigation, and control (GNC) systems 135 and one or more weapon systems 140. For instance, the survivability engine 105 may provide control outputs to the GNC systems 135 and the weapon systems 140 to implement one or more actions selected by the survivability engine 105.

In some embodiments, where the survivability planning system 100 is used in connection with a UAV, the survivability engine 105 may provide control signals to the GNC systems 135 to control one or more parameters of the operations of the UAV, including, but not limited to, flight path, aspect angle, altitude, and speed. In alternative embodiments, where the survivability planning system 100 is used in connection with a manned vehicle (e.g., an aircraft, a car, a motorcycle, a ship, etc.), outputs of the survivability engine 105 may be presented to a human operator as a recommendation or suggestion. Such a recommendation or suggestion may be presented visually (e.g., on a HUD, a dashboard, etc.), audibly (e.g., via speech synthesis), or in any other suitable manner. Similarly, the survivability engine 105 may provide control signals to the weapon systems 142 to configure the weapon systems 142 to detect, track, and engage one or more threats.

In various embodiments, the survivability engine 105 may present one or more recommendations for a course of action to a human operator in any suitable manner. For example, the recommendation may be a recommendation to perform a specific vehicle maneuver (e.g., to realize a particular route for the vehicle to follow), or any other action or actions related to guidance, navigation, and control functions. As another example, the recommendation may be a recommendation to perform any action or actions related to weapon systems of the vehicle. Recommendations may be presented using any input/output devices of the survivability planning system. As such, recommendations may be provided using any suitable modality including, but not limited to, devices for presenting information aurally, visually, and/or tactually.

While examples of various components of a survivability planning system are discussed above in connection with FIG. 1, it should be appreciated that such examples are provided solely for illustrative purposes. Other combinations of components may also be suitable, as aspects of the present disclosure are not so limited.

Figure 2:
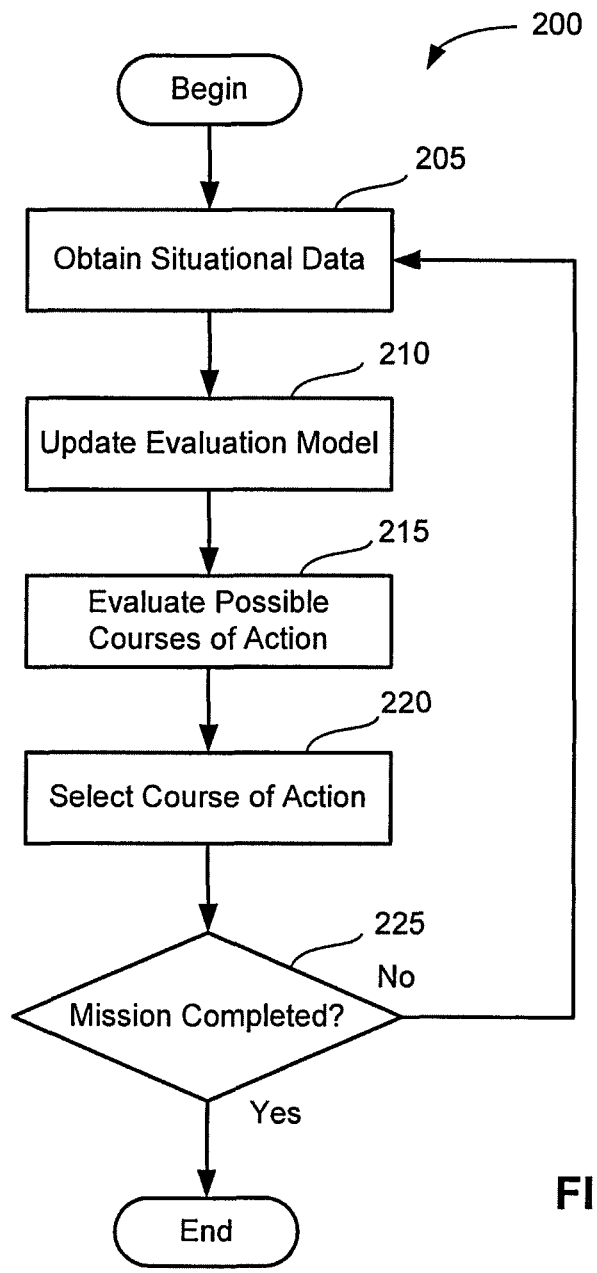
FIG. 2 shows an illustrative process that may be performed by a survivability planning system to improve vehicle survivability during a mission, in accordance with some embodiments.

FIG. 2 shows an illustrative process 200 that may be performed by a survivability planning system to improve vehicle survivability during a mission, in accordance with some embodiments. For example, the process 200 may be performed by the survivability engine 105 shown in FIG. 1 to select one or more appropriate actions in a given scenario.

At act 205, the survivability planning system may obtain situational data relating to an actual or hypothetical scenario in which the vehicle may be operating. The situational data may be received from any suitable source, such as a sensor, a user input device, or a communications device, or may be retrieved from a suitable data storage. As discussed above in connection with FIG. 1, situational data may include any information that may be useful in selecting an appropriate action in the scenario. For example, the situational data may include information relating to the vehicle's own capabilities, such as the ability to maneuver in a certain way under certain conditions, to detect a threat, or to attack a threat. As another example, the situational data may include information relating to known or potential threats that the vehicle may encounter, such as locations and types of such threats. As yet another example, the situational data may include information relating to environmental conditions, such as weather and terrain conditions and locations and capabilities of friendly entities. Other types of situational data may also be suitable, as aspects of the present disclosure are not limited to the use of any particular types of situational data.

At act 210, the survivability planning system may use the situational data obtained at act 205 to update an evaluation model for use in selecting one or more appropriate actions for the vehicle in the given scenario. In some illustrative embodiments, the evaluation model may be a mathematical model that represents the actual or hypothetical scenario in which the vehicle is operating. Such a model may be constructed using techniques described below in connection with FIGS. 3 and 4A-B, or any other suitable techniques, such as those generally known in the art.

Updating the evaluation model may, in some instances, include building a new model using the situational data obtained at act 205. Alternatively, the evaluation model may have been built previously, in which case updating the evaluation model may include modifying, deleting, or adding model parameters based on the situational data obtained at act 205. The situational data may be used to perform such an update with or without further processing.

Having updated the evaluation model, the survivability planning system may proceed to act 215 to evaluate possible courses of action for the vehicle. This evaluation may be performed using any suitable criterion or combination of criteria. In one example, the survivability planning system may seek to identify potential courses of action that may completely avoid detection by any threat. In another example, the survivability planning system may use a more relaxed criterion, for example by tolerating some detection so long as no threat would have sufficient time to track and engage the vehicle after detecting the vehicle. In yet another example, the survivability planning system may use a combination of different criteria, such as avoiding detection by any threat while maintaining effectiveness of countermeasures against any threat.

In some embodiments, some of the criteria used by the survivability planning system may be probabilistic. For instance, the survivability planning system may seek to identify potential courses of action for which the probability that the vehicle survives the mission is above an accepted threshold. Such an outcome probability may be derived based on various input probabilities, examples of which include, but are not limited to, a probability that the vehicle can be detected by a threat of a certain type located at a certain angle and a certain distance from the vehicle given certain weather and terrain conditions, a probability that the threat can successfully track and engage the vehicle given a certain window of exposure of the vehicle to the threat, and a probability that the vehicle can survive an attack by the threat.

In some further embodiments, the survivability planning system may use simulation data to inform the evaluation performed at act 215. For example, the survivability planning system may use the situational data obtained at act 205 to identify one or more matching scenarios for which simulation data is available from a suitable data store (e.g., the simulation data store 130 shown in FIG. 1). The available simulation data may include useful information such as probabilities of certain outcomes of interest. In this manner, the survivability planning system may be able to compare outcomes of different courses of action without having to perform extensive computations in real time.

Proceeding to act 220, the survivability planning system may select an optimal course of action for the vehicle in the given scenario based on the analysis performed at act 215. As discussed above, whether a course of action is preferred over another course of action may depend on the particular criterion or criteria employed by the survivability planning system. Furthermore, it should be appreciated that an "optimal" course of action need not be a most preferred course of action in an absolute sense. Rather, the survivability planning system may use any suitable approximation algorithms or heuristics to select a course of action that may be preferred over other courses of action. Such approximation algorithms or heuristics may be employed to improve response time or reduce computational requirements of the survivability planning system.

Proceeding to act 225, the survivability planning system may determine whether the vehicle has successfully completed the mission. If so, the process 200 may end. Otherwise, the process 200 may return to act 205 to obtain new situational data. In this manner, the survivability planning system may continually analyze up-to-date situational data and respond to changes by re-evaluating the vehicle's available options and possibly selecting a different course of action.

As mentioned above, the process 200 may be used to analyze a hypothetical scenario, which may be done in the context of a simulation. In that case, hypothetical situational data may be obtained at act 205, and one or more outcomes of the analysis performed at act 215 may be stored in association with the corresponding hypothetical situational data in a suitable data store (e.g., the simulation data store 130 shown in FIG. 1). Alternatively, the process 200 may be performed by a survivability planning system during an actual mission, in which case actual situational data may be obtained at act 205, and the course of action selected at act 220 may be implemented or presented to a human operator as a recommendation.

Figure 3:
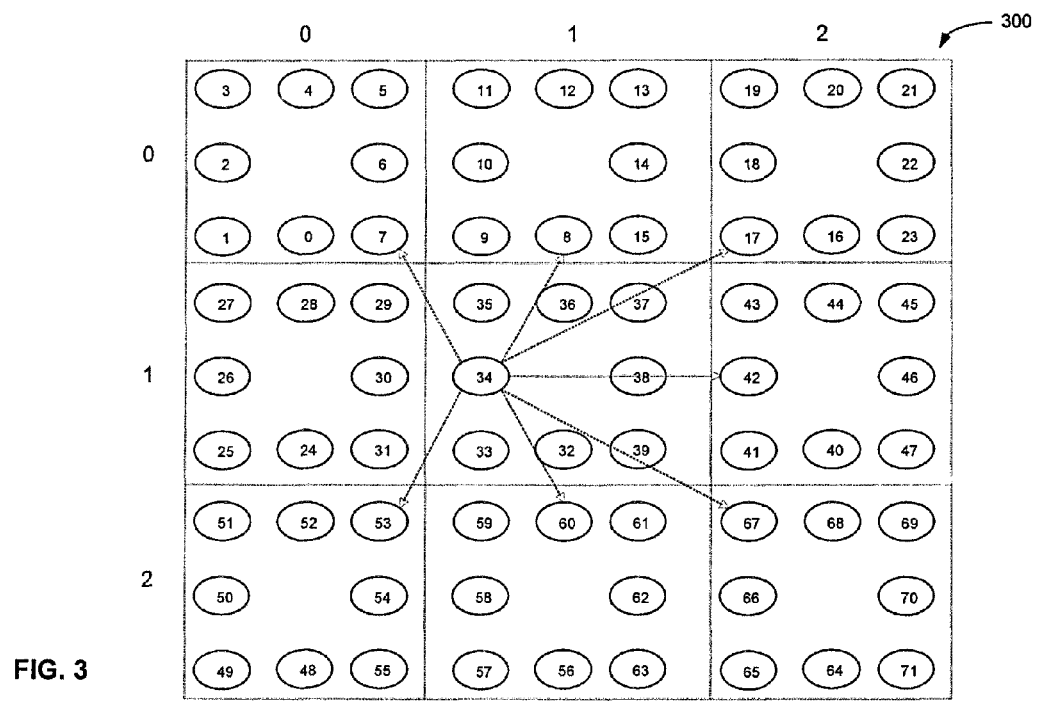
FIG. 3 shows an example of a mathematical model that can be used to represent a vehicle-to-threat scenario, in accordance with some embodiments.

Turning to FIG. 3, an example of a mathematical model 300 is illustrated that can be used to represent a vehicle-to-threat scenario, in accordance with some embodiments. In this example, a physical region to be traversed by a vehicle is modeled as a collection of cells arranged in a two-dimensional grid, and movement of the vehicle through the physical region is modeled as a sequence of maneuvers between cells.

Each cell in the illustrative model 300 may include a number of different nodes. For example, as shown in FIG. 3, cell <0,0> (e.g., the cell located at the upper left corner, at row 0 and column 0) may include eight nodes, labeled "0," "1," ..., "7." Each such node may represent a different angle at which the vehicle may enter cell <0,0>. For example, node 0 may represent the vehicle entering cell <0,0> from cell <1,0>, and node 7 may represent the vehicle entering cell <0,0> from cell <1,1>.

Furthermore, in the illustrated model 300, the vehicle may exit each cell in a number of different ways depending on how the vehicle entered the cell. For example, as illustrated in FIG. 3, the vehicle may be traveling from left to right at node 34 because the vehicle entered cell <1,1> from cell <1,0>. Assuming the vehicle cannot travel backwards or suspend its motion (e.g., as typically is the case for a fixed-wing aircraft), the vehicle can perform one of seven possible maneuvers from node 34, causing the vehicle to exit cell <1,1> and enter, respectively, cells <0,0>, <0,1>, <0,2>, <1,2>, <2,0>, <2,1>, and <2,2>.

Thus, the illustrative model 300 can be viewed as a state transition model, where each state is defined by some information relating to the vehicle (e.g., current location of the vehicle specified using quantized coordinates that divide a continuous physical region into a collection of discrete cells) and possibly some history information (e.g., how the vehicle entered a cell), and where transitions from given states are defined by actions the vehicle can perform (e.g., maneuvers that the vehicle is physically capable of performing) from that state.

It should be appreciated that the model 300 shown in FIG. 3 and described above is provided solely for purposes of illustration, as other types of models may also be used in connection with various inventive concepts disclosed herein. For instance, although the illustrative model 300 is a two-dimensional model, other dimensionality may also be used, as aspects of the present disclosure are not limited to any particular dimensionality. Furthermore, aspects of the present disclosure are not limited to any particular arrangement or geometry of cells, nor to any particular definitions of nodes and transitions.

Figure 4A:
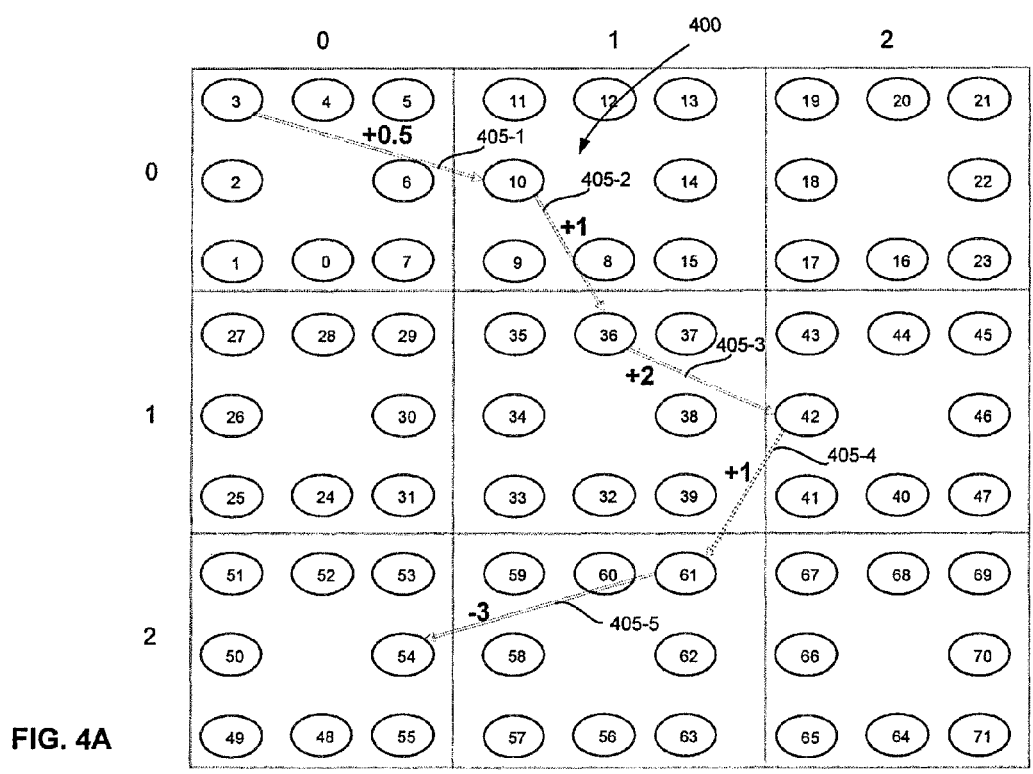
FIGS. 4A-B show an illustrative route for a vehicle modeled as a sequence of maneuvers each associated with a cost metric, in accordance with some embodiments.
Figure 4B:
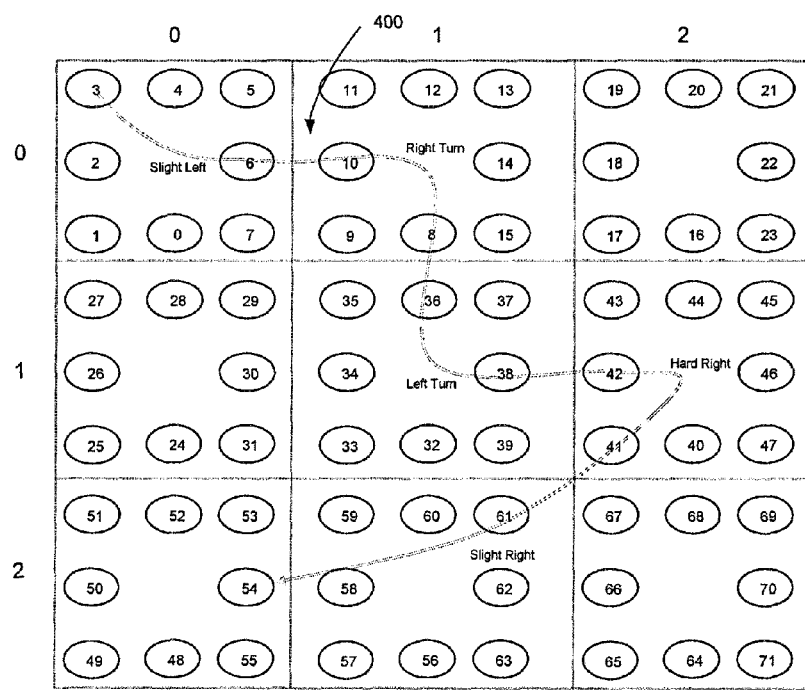

FIGS. 4A-B show an illustrative route 400 for a vehicle modeled as a sequence of maneuvers each associated with a cost metric, in accordance with some embodiments. In FIG. 4A, the illustrative route 400 is shown as a sequence of maneuvers between cells, whereas FIG. 4B shows an actual path that the vehicle may follow by executing the sequence of maneuvers shown in FIG. 4A. The underlying model used in this example may be similar to the model 300 described above in connection with FIG. 3.

In the example shown in FIG. 4A, the vehicle starts at node 3 which indicates the vehicle entered cell <0,0> from the upper left corner, thus traveling towards the lower right. The vehicle then transitions, at 405-1, from node 3 to node 10, exiting cell <0,0> and entering cell <0,1>. As shown in FIG. 4B, transition 405-1 corresponds to the vehicle executing a slight left turn while in cell <0,0>. From node 10, the vehicle transitions, at 405-2, to node 36, exiting cell <0,1> and entering cell <1,1>. As shown in FIG. 4B, transition 405-2 corresponds the vehicle executing a right turn while in cell <0,1>. From node 36, the vehicle transitions, at 405-3, to node 42, exiting cell <1,1> and entering cell <1,2>. As shown in FIG. 4B, transition 405-3 corresponds the vehicle executing a left turn while in cell <1,1>. From node 42, the vehicle transitions, at 405-4, to node 61, exiting cell <1,2> and entering cell <2,1>. As shown in FIG. 4B, transition 405-4 corresponds the vehicle executing a hard right turn while in cell <1,2>. Finally, from node 61, the vehicle transitions, at 405-5, to node 54, exiting cell <2,1> and entering cell <2,0>. As shown in FIG. 4B, transition 405-5 corresponds the vehicle executing a slight right turn while in cell <2,1>.

As discussed above, a survivability planning system may evaluate a sequence of maneuvers by assigning to each maneuver a numerical measure (or metric) indicative of how much positive or negative impact the maneuver may have on the overall survivability of the vehicle. Such a numerical measure may reflect any suitable combination of survivability factors that may affect the vehicle's abilities to detect a threat, evade detection by the threat, remove the threat using a countermeasure, and survive an attack by the threat.

For instance, in some embodiments, each maneuver may be assigned a cost metric that takes into account multiple factors, such as whether the maneuver leads the vehicle closer to or farther away from a threat, and whether the maneuver changes the orientation of the vehicle in such a way that the vehicle is more or less likely to be detected by a threat. As discussed in greater detail below in connection with FIGS. 5 and 6A-B, a cost metric may also take into account information regarding multiple threats, for example, by combining component cost metrics associated with different threats, where a different weight may be assigned to each component cost metric.

In the example shown in FIG. 4A, the transitions 405-1, ..., 405-5 may each be associated with a cost value (respectfully, +0.5, +1, +2, +1, and −3) representing the potential negative impact associated with the corresponding maneuver. As discussed above, such costs may be assigned in any suitable manner to take into account various aspects of vehicle survivability. For example, the illustrative cost pattern shown in FIG. 4A may result from a threat being present in cell <1,2>, so that cost increases as the vehicle moves closer to cell <1,2>. Furthermore, a positive cost may be incurred at transition 405-4, even though the corresponding maneuver may take the vehicle away from the threat, because making a hard right turn in cell <1,2> may increase the vehicle's exposure to a sensor of the threat (e.g., a jet plane may be more susceptible to detection by an IR sensor from behind because of the heat released by the jet engines).

While an illustrative cost pattern is shown in FIG. 4A and described above, it should be appreciated that aspects of the present disclosure are not limited to any particular methods for assigning numerical metrics to transitions in a model. For example, in addition to, or instead of, measures of cost, measures of utility may also be assigned to transitions to represent potential positive impact. As another example, in some further embodiments, cost metrics may be assigned to cells in a two-dimensional cellular cost map, where each cell may correspond to a particular combination of latitudinal and longitudinal coordinates. The cost metrics may be computed based on any available information that may be relevant for survivability of a vehicle. Examples of such information include, but are not limited to, inter-visibility, RF signature, IR signature, visual signature, and aspect angle to threat. Based on the available information, an amount of aspect angle variation that can be tolerated by the vehicle may be determined for each cell, and a number of aspect slices may be selected for consideration. For each selected aspect slice, a minimum exposure may be computed. For instance, the minimum exposure may be computed based on the physical maneuvering ability of the vehicle or constraints imposed by the need to perform other important tasks related to the mission. For example, the vehicle may be required to point a sensor in a specific direction and based on the limitations of where the sensor may point, the vehicle may be constrained to a certain range of aspect variation. An overall cost for the cell may then be computed based on a maximum of the minimums computed for the selected aspect slices. For example, the overall cost for the cell may be proportional to the maximum of the minimums computed for the selected aspect slices.

Again referring to FIGS. 4A-B, a total cost for the route 400 may be any suitable combination of the individual cost values, such as a weighted or un-weighted sum of the individual cost values. For instance, in some implementations, the individual cost values may be weighted according to immediacy of the corresponding maneuvers (e.g., the transition 405-1 may be accorded more weight than the transition 405-3 because the latter is further into the future). In this manner, the survivability planning system may select an appropriate course of action by searching for a sequence of transitions of a given length that may be less costly than other sequences of the same length.

Although specific examples of modeling techniques are described above in connection with FIGS. 3 and 4A-B, it should be appreciated that other modeling techniques may also be suitable, as aspects of the present disclosure are not limited to any particular way of modeling vehicle-to-threat scenarios. For example, in an embodiment in which measures of utility are used in addition to, or instead of, measures of cost, a survivability planning system may search for transition sequences with high utility and/or low cost.

Figure 5:
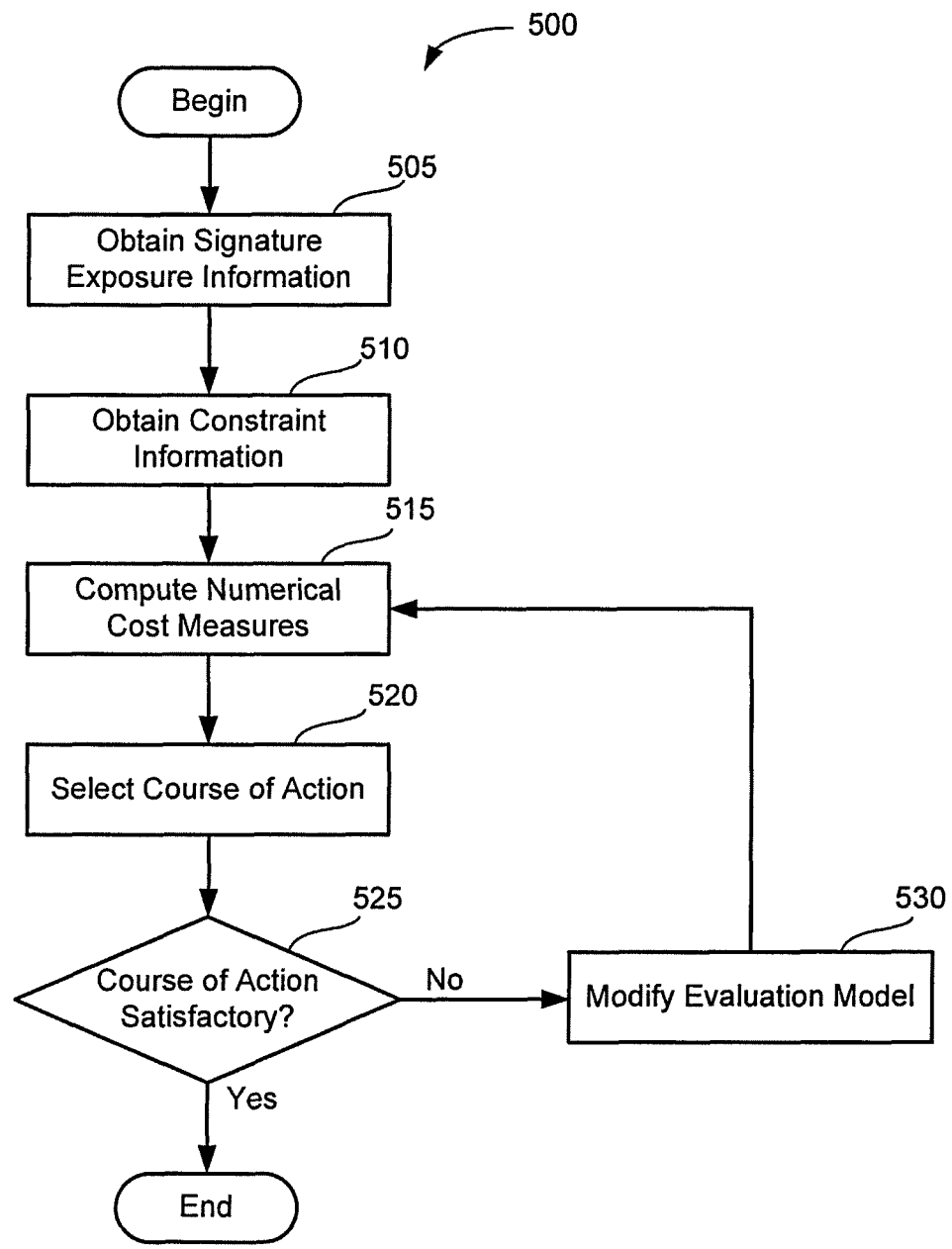
FIG. 5 shows an illustrative process that may be performed by a survivability planning system to select a possible course of action for a vehicle in an actual or hypothetical vehicle-to-threat scenario, in accordance with some embodiments.

FIG. 5 shows an illustrative process 500 that may be performed by a survivability planning system to select a possible course of action for a vehicle in an actual or hypothetical vehicle-to-threat scenario, in accordance with some embodiments. For example, the process 500 may be performed by the survivability engine 105 shown in FIG. 1 to select an appropriate course of action in a given scenario.

Figure 6A:
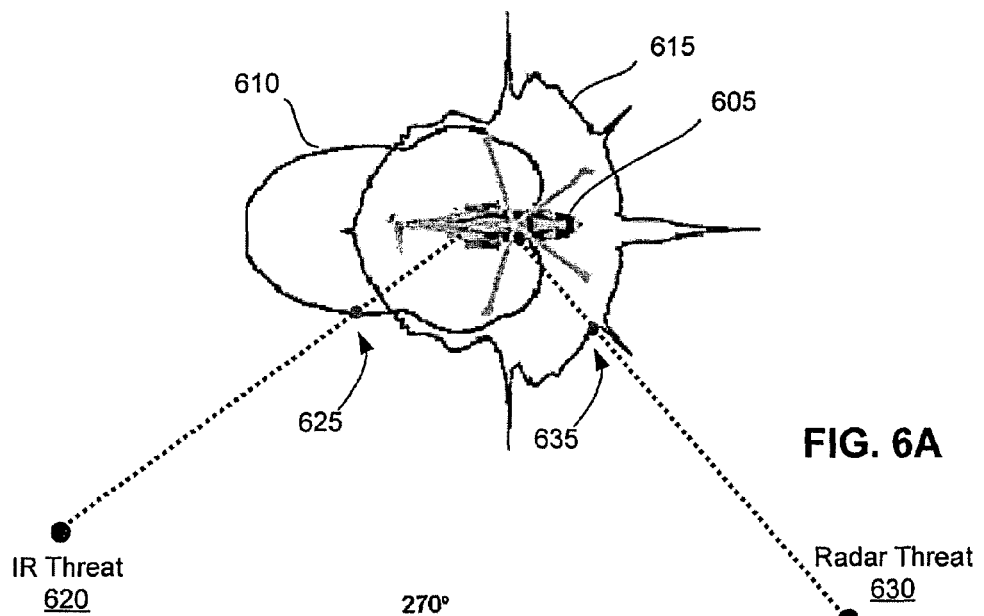
FIG. 6A shows an example of two signature exposure models that can be used to estimate how easily a vehicle can be detected from various angles by a threat, in accordance with some embodiments.

At act 505, the survivability planning system may obtain signature exposure information indicative of the vehicle's susceptibility to detection by one or more threats. Because different threats (or even the same threat) may be equipped with different sensing technologies, different signature exposure models may be included in the signature exposure information. Furthermore, the signature exposure information may depend on a type of the vehicle, because different types of vehicles may have different attributes such as size, shape, and engine location. In some embodiments, the survivability planning system may obtain signature exposure information by retrieving one or more signature exposure models from the illustrative signature data store 145 shown in FIG. 1 and described above. FIG. 6A shows an illustrative example of two signature exposure models that can be used to estimate how easily a vehicle (e.g., a helicopter 605) can be detected from various angles by a threat, in accordance with some embodiments. In this example, a first signature exposure model is associated with IR technology and is represented by a curve 610 around the helicopter 605, and a second signature exposure model is associated with radar technology and is represented by a curve 615 around the helicopter 605.

In the example shown in FIG. 6A, a line is drawn between the helicopter 605 and an IR threat 620, intersecting the curve 610 at a point 625. The distance between the point 625 and the helicopter 605 may be indicative of how easily the IR threat 620 can detect the helicopter 605 from the particular direction shown in FIG. 6A. Thus, in this example, the curve 610 indicates that the helicopter 605 is more susceptible to detection by an IR sensor from the back than from the front, which may be due to heat being released by engines the helicopter 605.

Similarly, in the example shown in FIG. 6A, a line is drawn between the helicopter 605 and the radar threat 630, intersecting the curve 615 at a point 635. The distance between the point 635 and the helicopter 605 is indicative of how easily the radar threat 630 can detect the helicopter 605 from the particular direction shown in FIG. 6A. Thus, in this example, the curve 615 indicates that the helicopter 605 is more susceptible to detection by a radar from the front and at certain angles from the side, which may be due to the shapes of the nose and the rotor blades.

Returning to FIG. 5, the signature information obtained at act 505 may be processed, for example, to combine signature exposure models of different threats. As discussed in greater detail below in connection with acts 515 and 520, a combined signature exposure model may be used to select a course of action that may reduce the vehicle's overall signature exposure with respect to multiple threats (although the selected course of action may not be optimal with respect to any individual threat). The combination may be done in any suitable manner, for example, to reflect desired trade-offs among the different threats.

Figure 6B:
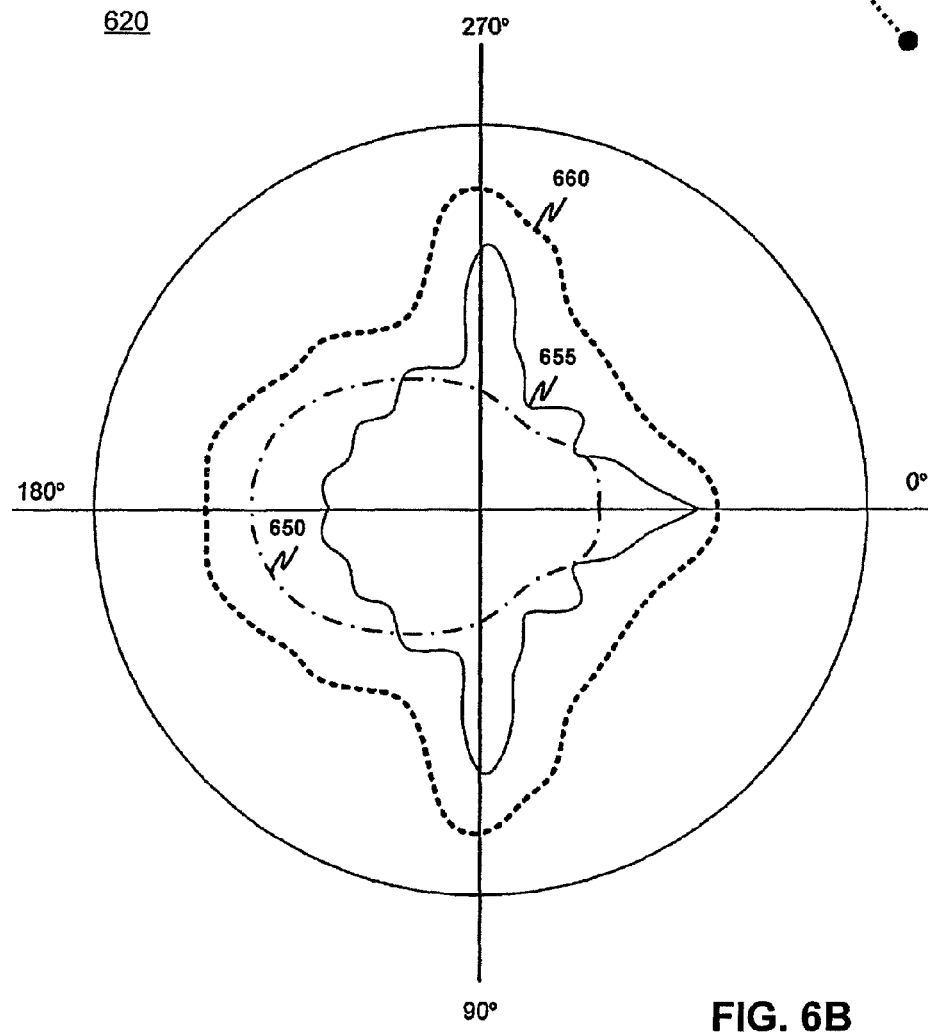
FIG. 6B shows an example of a combined signature exposure model, in accordance with some embodiments.

In one embodiment, as illustrated in FIG. 6B, two different signature exposure models, represented respectively by the curves 650 and 655, may be added together to obtain a third signature exposure model, represented by a curve 660. Signature exposure models may be added in any suitable way. For example, two or more signature exposure models may be added by adding values stored in association with corresponding pairs of azimuth-elevation coordinates in the signature exposure models being added. This sum may, although need not, be weighted, where the weights may reflect which threat is considered to be more important in a given situation. For example, as discussed in greater detail below in connection with FIG. 7, the weights may change depending when the vehicle is believed to have been exposed to a threat and how much time has elapsed since the initial exposure.

Figure 7:
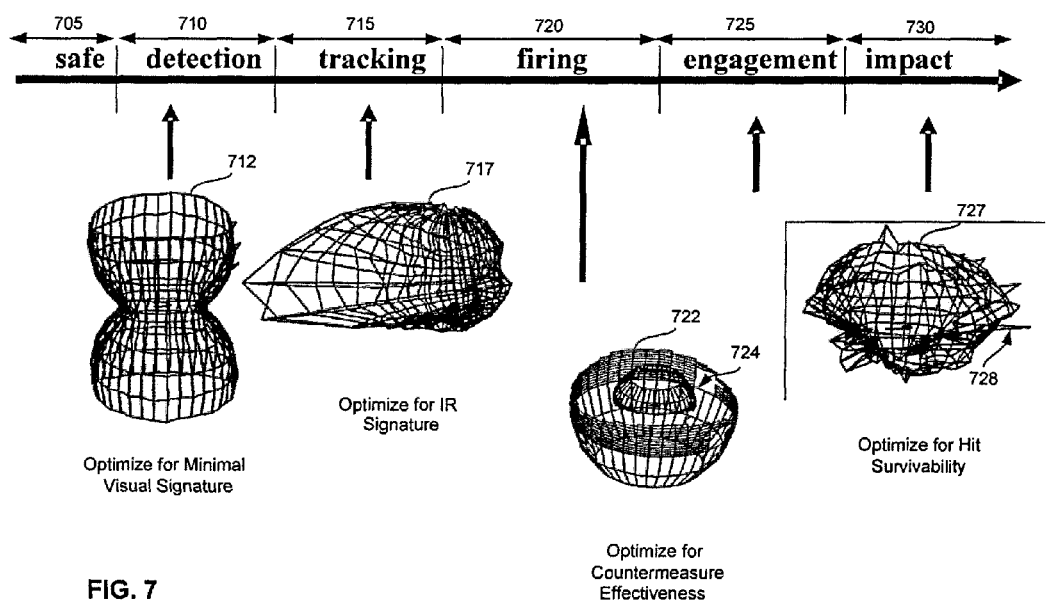
FIG. 7 shows an illustrative mission timeline divided into multiple stages, in accordance with some embodiments.
Figure 8:
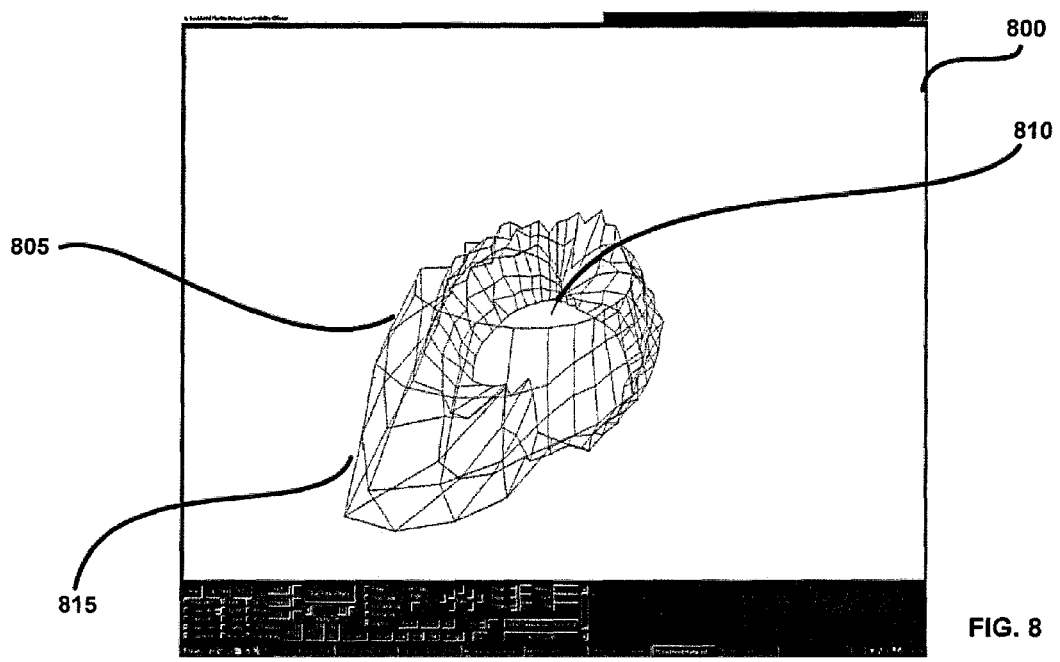
FIG. 8 shows an illustrative graphical user interface that can be used to visually render a quantity of interest to a human operator, in accordance with some embodiments.

Although specific examples of signature exposure models and methods for combining signature exposure models are discussed in connection with FIGS. 6A-B, it should be appreciated that the present disclosure is not limited to any particular type of signature exposure models, nor to any particular method of combination. For example, although two-dimensional signature exposure models (e.g., curves) are shown in FIGS. 6A-B, signature exposure models may also be three-dimensional (3D), as shown in FIGS. 7-8 and discussed below.

Returning again to FIG. 5, the survivability planning system may obtain constraint information at act 510. Constraints may be used to model various mission requirements, examples of which include, but are not limited to, mission deadline, sensor obscuration, vehicle vulnerability, and countermeasure effectiveness. For example, a sensor clearance obscuration may be imposed to avoid combinations of vehicle location and vehicle orientation that may cause an object (e.g., landing gear, in an embodiment in which the vehicle is an aircraft) to obscure a threat from a sensor on the vehicle. As another example, a vehicle vulnerability constraint may be imposed to avoid combinations of vehicle location and vehicle orientation that may cause a particularly vulnerable portion of the vehicle to be exposed to an attack by a threat. As yet another example, a countermeasure effectiveness constraint may be imposed to avoid combinations of vehicle location and vehicle orientation that may prevent countermeasures from effectively attacking a threat. As yet another example, a mission deadline constraint may be imposed to require completion of a mission by an absolute deadline or a relative deadline (e.g., relative to a start time of the mission). Evaluating such a constraint may involve examining mission history, which may be represented as a sequence of transitions in a state transition model.

As yet another example, a mission stage deadline constraint may be imposed to require completion of a course of action, such as any of the previously-described courses of action, before the completion of a particular stage of the mission. Accordingly, the survivability planning system may estimate the duration of one or more mission stages and may estimate how much time remains in a particular stage of a mission. Mission stages and examples of mission stages are described in more detail below with reference to FIG. 7.

At act 515, the survivability planning system may compute numerical cost measures for various actions that may be executed by the vehicle. As previously mentioned, the action may be executed by the vehicle for any suitable purpose and, for example, may be executed in response to detecting a threat, to avoid the threat, to mitigate/reduce the threat, and/or to eliminate the threat. Some examples of actions that may be taken include, but are not limited to, firing one or more weapons, changing speed, altitude, heading or orientation, performing a maneuver, and deploying a countermeasure (e.g., jamming a communication channel). In some embodiments, such an action may be modeled as a transition from one state to another in a state transition model, where each state may contain information indicative of situational conditions at a corresponding point during a mission and possibly information indicative of mission history up to that point.

The survivability planning system may select an action to be analyzed in any suitable manner. For example, if the process 500 is performed in the context of a simulation, the goal may be to analyze all possible actions, so the survivability planning system may simply select the actions one by one in any suitable order. As another example, the selection may be randomized (e.g., by randomly selecting one or more action parameters). As yet another example, the survivability planning system may use any suitable strategies or heuristics designed to facilitate efficient selection of appropriate actions. For instance, in an embodiment in which a state transition model is used, the survivability planning system may identify and reduce states and/or transitions that may lead to indistinguishable outcomes.

In various embodiments, the survivability planning system may compute the numerical cost measures based on any suitable combination of factors. For instance, the survivability planning system may take into account one or more measures of signature exposure (e.g., as discussed above in connection with act 505) and one or more constraints (e.g., as discussed above in connection with act 510). As a more specific example, a higher cost may be associated with an action if the action is likely to increase the vehicle's signature exposure and/or cause one or more constraints to be violated.

In some embodiments, numerical measures corresponding to signature exposure to different threat sensors and/or numerical measures corresponding to different constraints may be weighted differently depending on time-to-engagement estimates. For example, an individual cost measure corresponding to a threat that is estimated to have had sufficient time to detect and track the vehicle may be weighted more heavily compared to an individual cost measure corresponding to a threat that is estimated not to have had sufficient time to detect and track the vehicle. An illustrative example of such a weighting scheme is described in greater detail below in connection with FIG. 7. However, it should be appreciated that other weighting schemes may also be used, as aspects of the present disclosure are not limited to any particular method for combining numerical measures.

Having computed numerical cost measures at act 515, the survivability planning system may proceed to act 520 to select an appropriate course of action. Any suitable optimization techniques may be used for that purpose, such as techniques that seek to decrease cost and/or increase utility over some suitable horizon (which may be finite or infinite). For example, in an embodiment in which a combined cost is computed for each action at act 515 to take into account signature exposure with respect to multiple threat sensors, an optimization technique that seeks to minimize cost may be used to select a course of action that reduces the risk of the vehicle being detected by any of the threat sensors. Additionally, alternative courses of action (e.g., second-best course of action, third-best course of action, etc., as determined by the optimization technique) may be identified in act 520.

At act 525, the survivability planning system may evaluate the course of action selected at act 520. For instance, the survivability planning system may check whether any of the constraints discussed above in connection with act 510 may be violated as a result of executing the selected course of action. For example, the survivability planning system may check whether the course of action was completed before the completion of a particular mission stage. As another example, the survivability planning system may check whether the course of action is a physically-realizable maneuver. Alternatively, or additionally, the selected course of action may be presented to a human operator for review and approval, where the human operator may be onboard the vehicle, or may be controlling the vehicle remotely.

If it is determined at act 525 that the course of action selected at act 520 is satisfactory, the process 500 may end and the selected course of action may be executed by the vehicle. If it is determined at act 525 that the course of action selected at act 520 is not satisfactory, the process 500 may select one of the alternative course of action identified at act 520 to determine whether that course of action may be satisfactory. Additionally, or alternatively, the process 500 may proceed to modify one or more parameters of the evaluation model used at acts 515 and 520. In one example, a different vehicle type may be selected with different maneuver, detection, and/or countermeasure capabilities. In another example, different mission start time and/or start location may be selected. Other types of modifications may also be suitable, as aspects of the present disclosure are not limited to any particular way of modifying the evaluation model.

Having modified the evaluation model at act 530, the process 500 may return to act 515 to repeat the analysis and select another course of action. This may continue until a satisfactory course of action is identified, or until some stopping condition is reached (e.g., a deadline or a certain number of allowed iterations).

While illustrative techniques for selecting a course of action for a vehicle are discussed above in connection with FIG. 5, it should be appreciated that aspects of the present disclosure are not limited to any particular technique or combination of techniques. For example, any suitable part of the process 500 may be made probabilistic, for example, by replacing deterministic input values with input probability distributions. For example, a probability distribution may be provided over likely locations of each threat, and another probability distribution may be provided over likely types of each threat and associated detection and attack capabilities. In this manner, possible courses of action may be evaluated based on probabilistic criteria (e.g., whether a vehicle is estimated to survive a mission with a probability higher than some threshold value). As another example, a course of action may be selected using an approach other than by computing numerical cost measures. For instance, a course of action may be selected applying one or more rules to available situational data and/or signature exposure models.

As discussed above, the survivability planning system may accord different weights to different factors depending on a stage of a mission. FIG. 7 shows an illustrative embodiment in which a mission timeline is divided into multiple stages, namely, a "safe" stage 705, a "detection" stage 710, a "tracking" stage 715, a "firing" stage 720, an "engagement" stage 725, and an "impact" stage 730. These stages may differ in the degree of danger a threat may pose to a vehicle in each stage.

At the safe stage 705, the survivability planning system may determine that the vehicle is unlikely to have been detected by any threat, for example, because each known threat is more than a corresponding threshold distance (e.g., the distance at which there exists a 10% or lower chance of being detected by the threat) away from the vehicle and sensors onboard the vehicle have not detected any pop-up threat.

At the detection stage 710, the survivability planning system may determine that the vehicle is likely to be detected by a threat. This stage may be entered when some threat is no more than the corresponding threshold distance (e.g., the distance at which there exists at least a 50% chance of being detected by the threat) away from the vehicle due to relative movement between the vehicle and the threat. Alternatively, the detection stage 710 may be entered when a sensor onboard the vehicle detects a pop-up threat, or when a notification of the presence of a pop-up threat is received via a communication interface. Once the detection stage 710 is entered, the survivability planning system may optimize for reduced visual signature, for example, by assigning a greater weight to a measure of visual signature when computing numerical cost measures at act 515 of FIG. 5. An illustrative representation 712 of a measure of visual signature is shown in FIG. 7, having an hourglass shape indicating that the vehicle is more easily seen from above or below than from the side.

At the tracking stage 715, the survivability planning system may determine that the threat is likely to have detected and begun tracking the vehicle. This stage may be entered when, for instance, the vehicle has entered a detection range (e.g., visual range, IR range, radar range, etc.) of the threat for more than a corresponding threshold period of time (e.g., the time at which there exists at least a 50% chance that the threat has begun tracking the vehicle). Alternatively, the tracking stage 715 may be entered when a sensor onboard the vehicle confirms that the threat has detected the vehicle. Once the tracking stage 715 is entered, the survivability planning system may optimize for reduced signature (e.g., visual signature, IR signature, radar signature, etc.), for example, by assigning a greater weight to a measure of signature (e.g., visual signature, IR signature, radar signature, etc.) when computing numerical cost measures at act 515 of FIG. 5. An illustrative representation 717 of a measure of IR signature is shown in FIG. 7 in association with the tracking stage 715, indicating that the vehicle is more easily tracked from behind than from the front by an IR sensor.

It should be appreciated that aspects of the present disclosure are not limited to the use of signature exposure measures based on any particular detection technology. Rather, signature exposure measures based on any suitable detection technology, or combination of detection technologies, may be used to evaluate different courses of actions for a vehicle. Furthermore, aspects of the present disclosure are not limited to the use of signature exposure measures, as other types of measures may also be suitable. For example, any suitable measure may be used to represent aspect- and/or elevation-dependent data around a vehicle, such as data relating one or more constraints (e.g., sensor obscuration), data relating one or more transmission patterns (e.g., the vehicle's ability to jam, or transmit over, a communication channel), data relating to countermeasure effectiveness, data relating to hit survivability, and any suitable combination thereof. Examples of such measures are discussed below in connection with the firing stage 720, the engagement stage 725, and the impact stage 730 of FIG. 7.

At the firing stage 720, the survivability planning system may determine that the threat is likely to have locked on to the vehicle and be preparing to fire. This stage may be entered when, for instance, the tracking stage 715 has lasted for more than a corresponding threshold period of time (e.g., the time at which there exists at least a 50% chance of lock occurring). Alternatively, the firing stage 720 may be entered when a sensor onboard the vehicle confirms that the threat has locked on to the vehicle. Once the firing stage 720 is entered, the survivability planning system may optimize for countermeasure effectiveness, for example, by assigning a greater weight to a measure of countermeasure effectiveness when computing numerical cost measures at act 515 of FIG. 5. An illustrative representation 722 of a measure of countermeasure effectiveness is shown in FIG. 7, indicating that a target below the vehicle can be attacked more effectively than a target above the vehicle, and that a threat located at certain angles from the vehicle (e.g., through an opening 724 in the representation 722) cannot be effective attacked.

At the engagement stage 725, the survivability planning system may determine that the threat is likely to have engaged the vehicle. This stage may be entered when, for instance, the firing stage 720 has lasted for more than a corresponding threshold period of time (e.g., the time at which there exists at least a 50% chance of the threat firing a weapon at the vehicle). Alternatively, the engagement stage 725 may be entered when a sensor onboard the vehicle confirms that a weapon of the threat has fired against the vehicle. Once the engagement stage 720 is entered, the survivability planning system may optimize for hit survivability, for example, by assigning a greater weight to a measure of hit survivability when computing numerical cost measures at act 515 of FIG. 5. An illustrative representation 727 of a measure of hit survivability is shown in FIG. 7, having various spikes corresponding to portions of the vehicle that are more vulnerable than others. For example, a spike 728 may indicate that the vehicle is particularly vulnerable to a hit from the front.

At the impact stage 730, the survivability planning system may determine that the threat has engaged the vehicle and impact is imminent, and may continue to optimize for hit survivability, as in the engagement stage 725. The impact stage 730 may be entered when, for instance, the engagement stage 725 has lasted for more than a corresponding threshold period of time (e.g., the time at which there exists at least a 50% chance of impact occurring). Alternatively, the impact stage 730 may be entered when a sensor onboard the vehicle confirms that a missile fired by the threat is less than a corresponding threshold distance away from the vehicle.

While an illustrative timeline and associated optimization strategies are discussed above in connection with FIG. 7, it should be appreciated that aspects of the present disclosure are not limited to the use of a timeline, nor to any particular optimization strategy. Furthermore, in an embodiment in which a timeline is used, transitions between various stages may be defined in any suitable manner. For instance, any of the stages described above may be entered based on input from a human operator onboard the vehicle, instead of, or in addition to, analysis of automatically collected data.

FIG. 8 shows an illustrative graphical user interface (GUI) 800 that may be used to visually render a quantity of interest to a human operator, in accordance with some embodiments. For example, in some embodiments, the GUI 800 may be used to visually render a numerical measure indicative of a vehicle's signature exposure to a threat sensor or a numerical measure corresponding to a constraint.

In the example shown in FIG. 8, the GUI 800 is used to render a 3D space in a 2D representation of a vehicle's signature exposure to a radar. The 2D representation is in the form of a surface 805 surrounding a representation 810 of the vehicle, so that, in any given direction, a distance between the surface 805 and the representation 810 may be indicative of a level of signature exposure in that particular direction. For example, as indicated by the presence of a protrusion 815, the vehicle may be more susceptible to detection by a radar from the rear due to the shape of the nose of the vehicle. In this manner, a human operator may be able to more quickly and easily interpret numerical measures computed by a survivability planning system.

Figure 9:
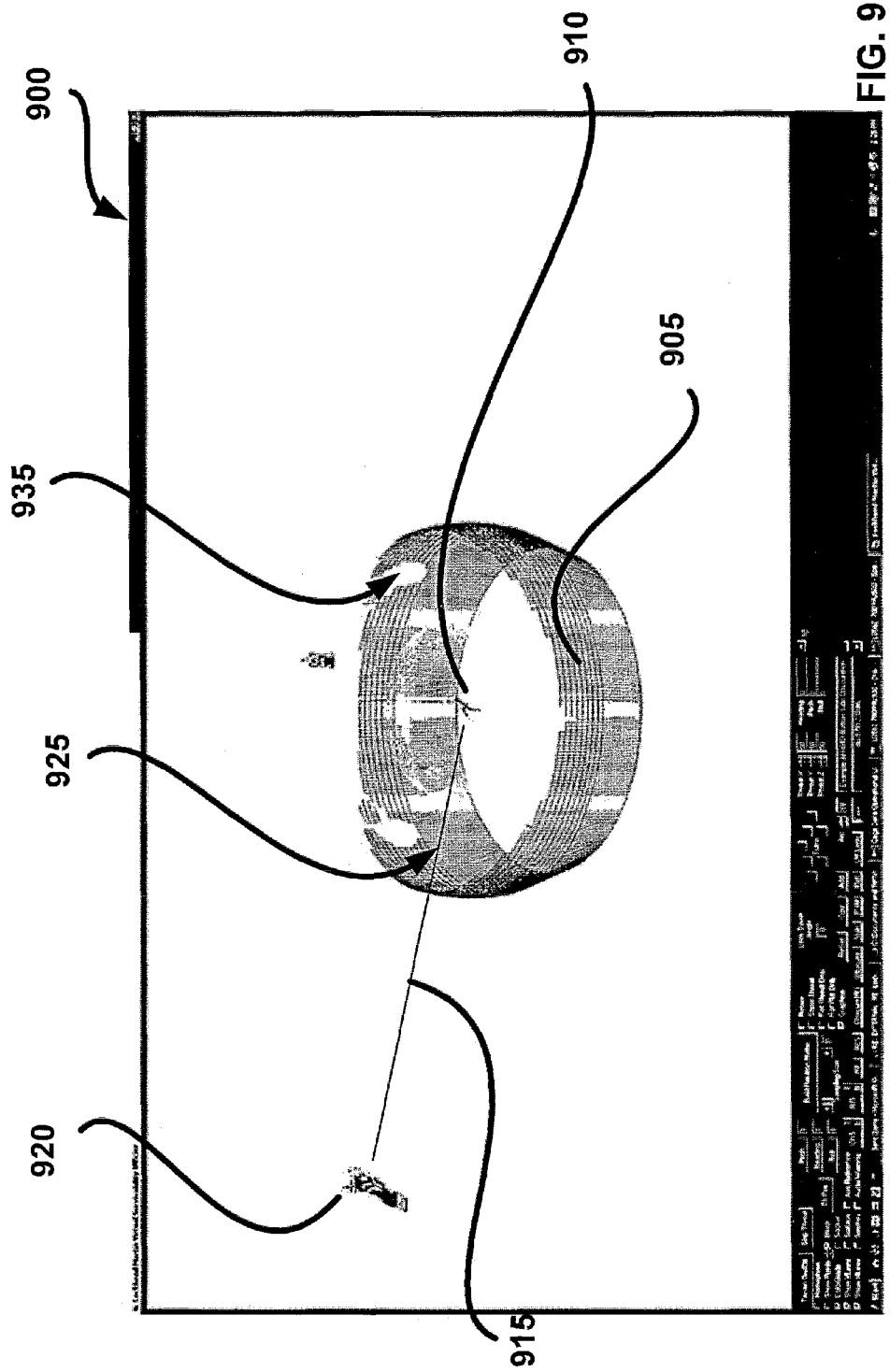
FIG. 9 shows another illustrative graphical user interface that can be used to visually render a quantity of interest to a human operator, in accordance with some embodiments.

FIG. 9 shows another illustrative GUI 900 that may be used to visually render a quantity of interest to a human operator, in accordance with some embodiments. For example, as with the illustrative GUI 800, the GUI 900 may be used to visually render a numerical measure indicative of a vehicle's signature exposure to a threat sensor or a numerical measure corresponding to a constraint.

In the example shown in FIG. 9, the GUI 900 is used to render a 3D space in a 2D representation of an obscuration constraint associated with a sensor on a vehicle. The 2D representation is in the form of a surface 905 surrounding a representation 910 of the vehicle, so that, in any given direction, a distance between the surface 905 and the representation 910 may be indicative of whether the sensor may be obscured by some object from sensing in that direction. For instance, as illustrated by a line 915 between the representation 910 of the vehicle and a representation 920 of a threat, intersecting the surface 905 at a point 925, the distance between the surface 905 and the representation 910 may be non-zero, which may indicate that the sensor on the vehicle is not obscured in that direction. By contrast, as indicated by the presence of "holes" in the surface 905, such as a "hole" 935, the sensor in this example may be obscured by the vehicle's landing gear from sensing in certain directions.

It should be appreciated that the GUI 800 shown in FIG. 8 and the GUI 900 shown in FIG. 9 are merely illustrative, as other types of GUIs may also be suitable. For example, instead of rending a 2D representation of a 3D space, a 2D representation may be rendered of a 2D space (e.g., as shown in FIG. 6AB). Furthermore, instead of rending a 2D representation as a mesh or shadow, the 2D representation may be rendered in any other suitable manner, including, but not limited to, as a solid surface. Further still, a representation may be rendered against any suitable background, such as an image of the terrain over which the vehicle is traveling, which may be a computer generated image, a satellite image, or any other suitable types of images. However, in alternative embodiments, background images may not be used at all.

Figure 10:
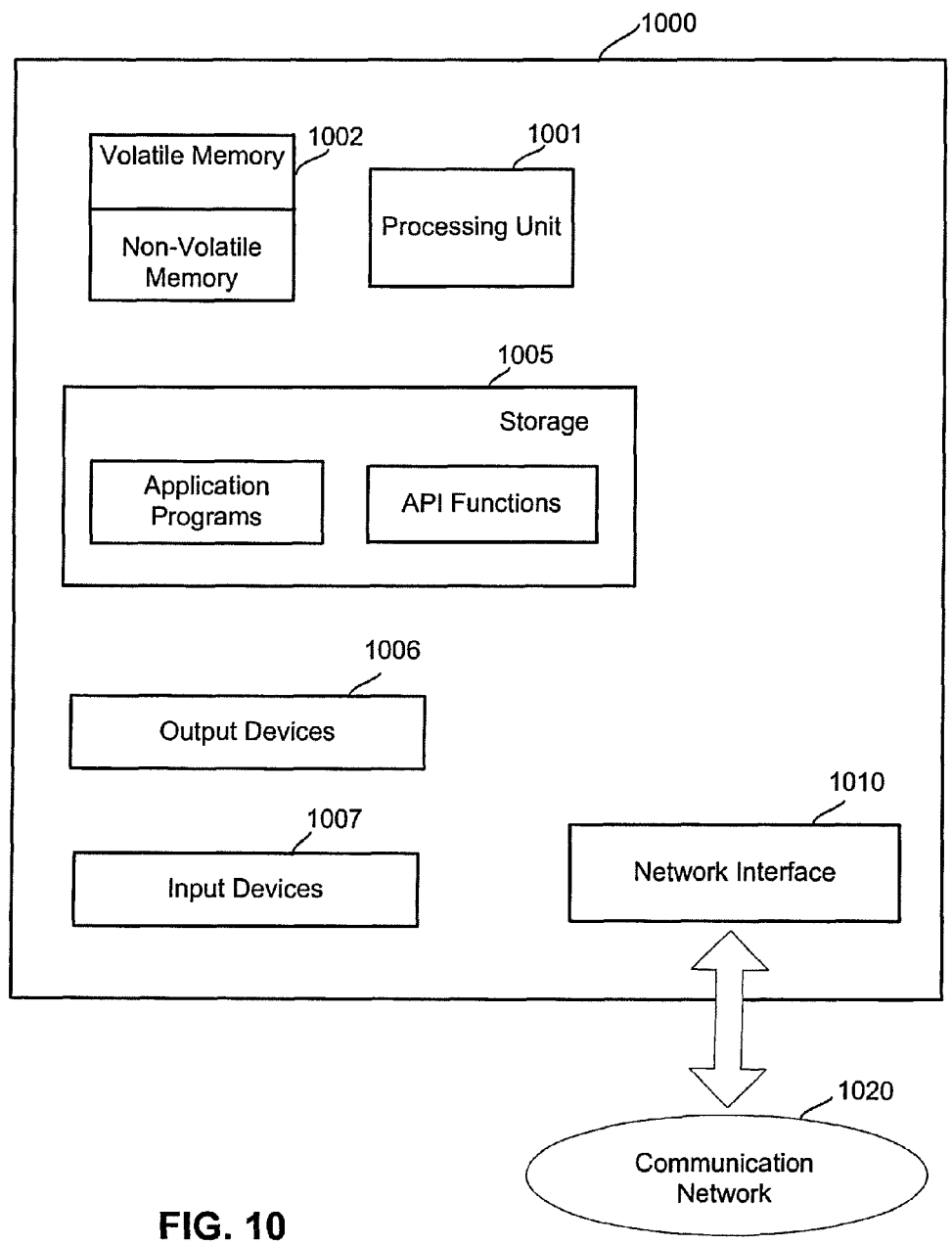
FIG. 10 shows, schematically, an illustrative computer on which various inventive aspects of the present disclosure can be implemented.

FIG. 10 shows, schematically, an illustrative computer 1000 on which various inventive aspects of the present disclosure may be implemented. The computer 1000 includes a processor or processing unit 1001 and a memory 1002 that may include volatile and/or non-volatile memory. The computer 1000 may also include storage 1005 (e.g., one or more disk drives) in addition to the system memory 1002. The memory 1002 may store one or more instructions to program the processing unit 1001 to perform any of the functions described herein. The memory 1002 may also store one more application programs and/or Application Programming Interface (API) functions.

The computer 1000 may have one or more input devices and/or output devices, such as devices 1006 and 1007 illustrated in FIG. 10. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards and pointing devices, such as mice, touch pads, and digitizing tablets. As another example, a computer may receive input information through speech recognition or in other audible format.

As shown in FIG. 10, the computer 1000 may also comprise one or more network interfaces (e.g., the network interface 1010) to enable communication via various networks (e.g., the network 1020). Examples of networks include a local area network or a wide area network, such as an enterprise network or the Internet. Such networks may be based on any suitable technology and operate according to any suitable protocol, and may include wireless networks, wired networks or fiber optic networks.

Having thus described several embodiments of inventive concepts, it is to be appreciated that various alterations, modifications, and improvements will readily occur to those skilled in the art. Such alterations, modifications, and improvements are intended to be within the spirit and scope of the inventive concepts disclosed herein. Accordingly, the foregoing description and drawings are by way of example only.

The above-described embodiments of can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a non-transitory computer readable medium (or multiple computer readable media) (e.g., a computer memory, one or more floppy discs, compact discs, optical discs, magnetic tapes, flash memories, circuit configurations in Field Programmable Gate Arrays or other semiconductor devices, or other non-transitory, tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. That perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

What is claimed is:

1. A system for improving vehicle survivability, comprising at least one processor programmed to:
    obtain mission information regarding a mission of at least one vehicle, the mission comprising a plurality of mission stages, the mission information comprising at least one signature exposure model associated with the at least one vehicle and at least one threat to the at least one vehicle;
    identify based, at least in part, on the mission information, at least one matching scenario for which simulation data is available;
    calculate a numerical measure for each potential action of a plurality of potential actions for the at least one vehicle based, at least in part, on a mission stage of the plurality of mission stages during which the potential action is to be taken and the at least one signature exposure model to obtain a plurality of numerical measures; and
    select, based, at least in part, on the plurality of numerical measures and the simulation data for the at least one matching scenario, a sequence of actions to be executed by the at least one vehicle to improve the at least one vehicle's survivability against a plurality of threats, wherein the sequence of actions comprises a first action by which the at least one vehicle is to enter a first cell in a physical region and a second action by which the at least one vehicle is to leave the first cell and enter a second cell in the physical region.

2. The system of claim 1, wherein calculating the numerical measure comprises calculating a combined numerical measure based at least in part on a plurality of constituent numerical measures.

3. The system of claim 2, wherein calculating the combined numerical measure comprises:
    selecting a weight for each of the plurality of constituent numerical measures based at least in part on the mission stage during which the potential action is to be taken; and
calculating the combined numerical measure as a weighted sum of the plurality of constituent numerical measures by using the selected weights to weight each summand.

4. The system of claim 3, wherein:
    the at least one signature exposure model comprises a visual signature exposure model associated with the at least one vehicle and the at least one threat;
    the plurality of constituent numerical measures comprises a measure of visual signature exposure of the at least one vehicle relative to the at least one threat, the measure of visual signature exposure determined based at least in part on the visual signature exposure model; and
    when the mission stage of the plurality of mission stages during which the potential action is to be taken is a detection stage, an increased weight is assigned to the measure of visual signature exposure of the at least one vehicle relative to the at least one threat.

5. The system of claim 3, wherein:
    the at least one signature exposure model comprises an infrared (IR) signature exposure model associated with the at least one vehicle and the at least one threat;
    the plurality of constituent numerical measures comprises a measure of IR signature exposure of the at least one vehicle relative to the at least one threat, the measure of IR signature exposure determined based at least in part on the IR signature exposure model; and
    when the mission stage of the plurality of mission stages during which the potential action is to be taken is a tracking stage, an increased weight is assigned to the measure of IR signature exposure of the at least one vehicle relative to the at least one threat.

6. The system of claim 3, wherein:
    the plurality of constituent numerical measures comprises a measure of countermeasure effectiveness against the at least one threat, the measure of countermeasure effectiveness determined based on at least in part on vehicle information relating to at least one sensor and at least one countermeasure of the at least one vehicle; and
    when the mission stage of the plurality of mission stages during which the potential action is to be taken is a firing stage, an increased weight is assigned to the measure of countermeasure effectiveness against the at least one threat.

7. The system of claim 3, wherein:
    vehicle information further comprises information relating to at least one vulnerable portion of the at least one vehicle;
    the plurality of constituent numerical measures comprises a measure of hit survivability of the at least one vehicle, the measure of hit survivability determined based at least in part on the information relating to the at least one vulnerable portion of the at least one vehicle; and
    when the mission stage of the plurality of mission stages during which the potential action is to be taken is an engagement or impact stage, an increased weight is assigned to the measure of hit survivability of the at least one vehicle.

8. The system of claim 1, wherein the numerical measure is assigned at least in part by applying at least one decision rule to vehicle information and the mission information.

9. A method for improving vehicle survivability, the method comprising:
    using at least one hardware processor to perform:
        obtaining mission information regarding a mission of at least one vehicle, the mission comprising a plurality of mission stages, the mission information comprising at least one signature exposure model associated with the at least one vehicle and at least one threat to the at least one vehicle;
        identifying based, at least in part, on the mission information, at least one matching scenario for which simulation data is available;
        calculating a numerical measure for each potential action of a plurality of potential actions for the at least one vehicle based, at least in part, on a mission stage of the plurality of mission stages during which the potential action is to be taken and the at least one signature exposure model to obtain a plurality of numerical measures; and selecting, based, at least in part, on the plurality of numerical measures and the simulation data for the at least one matching scenario, a sequence of actions to be executed by the at least one vehicle to improve the at least one vehicle's survivability against a plurality of threats, wherein the sequence of actions comprises a first action by which the at least one vehicle is to enter a first cell in a physical region and a second action by which the at least one vehicle is to leave the first cell and enter a second cell in the physical region.

10. The method of claim 9, wherein calculating the numerical measure comprises calculating a combined numerical measure based at least in part on a plurality of constituent numerical measures.

11. The method of claim 10, wherein calculating the combined numerical measure comprises:
selecting a weight for each of the plurality of constituent numerical measures based at least in part on the mission stage during which the potential action is to be taken; and
calculating the combined numerical measure as a weighted sum of the plurality of constituent numerical measures by using the selected weights to weight each summand.

12. The method of claim 11, wherein:
the at least one signature exposure model comprises a visual signature exposure model associated with the at least one vehicle and the at least one threat;
the plurality of constituent numerical measures comprises a measure of visual signature exposure of the at least one vehicle relative to the at least one threat, the measure of visual signature exposure determined based at least in part on the visual signature exposure model; and
when the mission stage of the plurality of mission stages during which the potential action is to be taken is a detection stage, an increased weight is assigned to the measure of visual signature exposure of the at least one vehicle relative to the at least one threat.

13. The method of claim 11, wherein:
the at least one signature exposure model comprises an infrared (IR) signature exposure model associated with the at least one vehicle and the at least one threat;
the plurality of constituent numerical measures comprises a measure of IR signature exposure of the at least one vehicle relative to the at least one threat, the measure of IR signature exposure determined based at least in part on the IR signature exposure model; and
when the mission stage of the plurality of mission stages during which the potential action is to be taken is a tracking stage, an increased weight is assigned to the measure of IR signature exposure of the at least one vehicle relative to the at least one threat.

14. The method of claim 11, wherein:
the plurality of constituent numerical measures comprises a measure of countermeasure effectiveness against the at least one threat, the measure of countermeasure effectiveness determined based at least in part on the vehicle information relating to at least one sensor and at least one countermeasure of at least one vehicle; and
when the mission stage of the plurality of mission stages during which the potential action is to be taken is a firing stage, an increased weight is assigned to the measure of countermeasure effectiveness against the at least one threat.

15. The method of claim 11, wherein:
vehicle information further comprises information relating to at least one vulnerable portion of the at least one vehicle;

the plurality of constituent numerical measures comprises a measure of hit survivability of the at least one vehicle, the measure of hit survivability determined based at least in part on the information relating to the at least one vulnerable portion of the at least one vehicle; and
when the mission stage of the plurality of mission stages during which the potential action is to be taken is an engagement or impact stage, an increased weight is assigned to the measure of hit survivability of the at least one vehicle.

16. The method of claim 11, wherein the numerical measure is assigned at least in part by applying at least one decision rule to vehicle information and the mission information.

17. At least one non-transitory computer-readable storage medium storing processor-executable instructions that, when executed by at least one processor, cause the at least one processor to:
obtain mission information regarding a mission of at least one vehicle, the mission comprising a plurality of mission stages, the mission information comprising at least one signature exposure model associated with the at least one vehicle and at least one threat to the at least one vehicle;
identify based, at least in part, on the mission information, at least one matching scenario for which simulation data is available;
calculate a numerical measure for each potential action of a plurality of potential actions for the at least one vehicle based, at least in part, on a mission stage of the plurality of mission stages during which the potential action is to be taken and the at least one signature exposure model to obtain a plurality of numerical measures; and
select, based, at least in part, on the plurality of numerical measures and the simulation data for the at least one matching scenario, a sequence of actions to be executed by the at least one vehicle to improve the at least one vehicle's survivability against a plurality of threats, wherein the sequence of actions comprises a first action by which the at least one vehicle is to enter a first cell in a physical region and a second action by which the at least one vehicle is to leave the first cell and enter a second cell in the physical region.

18. The at least one non-transitory computer-readable storage medium of claim 17, wherein calculating the numerical measure comprises calculating a combined numerical measure based at least in part on a plurality of constituent numerical measures.

19. The at least one non-transitory computer-readable storage medium of claim 18, wherein calculating the combined numerical measure comprises:
selecting a weight for each of the plurality of constituent numerical measures based at least in part on the mission stage during which the potential action is to be taken; and
calculating the combined numerical measure as a weighted sum of the plurality of constituent numerical measures by using the selected weights to weight each summand.

20. The at least one computer-readable storage medium of claim 19, wherein:
the at least one signature exposure model comprises a visual signature exposure model associated with the at least one vehicle and the at least one threat;
the plurality of constituent numerical measures comprises a measure of visual signature exposure of the at least one vehicle relative to the at least one threat, the measure of visual signature exposure determined based at least in part on the visual signature exposure model; and when the mission stage of the plurality of mission stages during which the potential action is to be taken is a detection stage, an increased weight is assigned to the measure of visual signature exposure of the at least one vehicle relative to the at least one threat.

\* \* \* \* \*